United States Patent
Wolstenholme

(10) Patent No.: US 9,553,099 B2
(45) Date of Patent: Jan. 24, 2017

(54) PILLAR ARRANGEMENT IN NAND MEMORY

(71) Applicant: Intel Corporation, Santa Clara, CA (US)

(72) Inventor: Graham Richard Wolstenholme, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/232,762

(22) Filed: Aug. 9, 2016

(65) Prior Publication Data

US 2016/0351578 A1    Dec. 1, 2016

Related U.S. Application Data

(63) Continuation of application No. 14/667,331, filed on Mar. 24, 2015.

(51) Int. Cl.
*H01L 27/115* (2006.01)
(52) U.S. Cl.
CPC ... *H01L 27/11551* (2013.01); *H01L 27/11524* (2013.01)
(58) Field of Classification Search
CPC .................................. H01L 27/11551
See application file for complete search history.

(56) References Cited

U.S. PATENT DOCUMENTS

| | | | |
|---|---|---|---|
| 8,154,068 B2* | 4/2012 | Katsumata | H01L 27/0688 257/314 |
| 8,198,670 B2* | 6/2012 | Aoyama | H01L 27/11565 257/316 |
| 8,644,046 B2* | 2/2014 | Seol | G11C 16/0408 365/51 |
| 2009/0323385 A1 | 12/2009 | Scheuerlein et al. | |
| 2010/0171162 A1 | 7/2010 | Katsumata et al. | |
| 2010/0202206 A1 | 8/2010 | Seol et al. | |

(Continued)

OTHER PUBLICATIONS

International Search Report and Written Opinion mailed Apr. 29, 2016, issued in corresponding International Application No. PCT/US2016/015212, 13 pages.

(Continued)

*Primary Examiner* — Lex Malsawma
(74) *Attorney, Agent, or Firm* — Schwabe, Williamson & Wyatt, P.C.

(57) ABSTRACT

Embodiments of the present disclosure are directed towards techniques and configurations for providing a 3D memory array apparatus. In one embodiment, the apparatus may comprise a substantially hexagonal arrangement having seven pillars disposed in a die in a repeating pattern. The arrangement may include first and second pillars disposed at a pillar pitch from each other in a first row; third, fourth, and fifth pillars disposed at the pillar pitch from each other in a second row; and sixth and seventh pillar disposed at the pillar pitch from each other in a third row and shifted relative to the first and second pillars respectively by a quarter of the pillar pitch in a direction that is substantially orthogonal to bitlines disposed in the die. Each pillar in the arrangement may be electrically coupled with a different bitline. Other embodiments may be described and/or claimed.

12 Claims, 5 Drawing Sheets

(56) References Cited

U.S. PATENT DOCUMENTS

| | | |
|---|---|---|
| 2010/0237400 A1 | 9/2010 | Aoyama |
| 2012/0273870 A1 | 11/2012 | Liu |
| 2013/0248974 A1 | 9/2013 | Alsmeier et al. |
| 2014/0054676 A1 | 2/2014 | Nam et al. |
| 2014/0063890 A1 | 3/2014 | Lee et al. |
| 2014/0145255 A1 | 5/2014 | Seol et al. |
| 2014/0332875 A1 | 11/2014 | Kim et al. |
| 2014/0369127 A1 | 12/2014 | Hara et al. |
| 2015/0008499 A1 | 1/2015 | Lee et al. |

OTHER PUBLICATIONS

Non-Final Office Action mailed Jun. 2, 2016, issued in corresponding U.S. Appl. No. 14/667,331, filed Mar. 24, 2015.
Notice of Allowance mailed Jul. 29, 2016, issued in corresponding U.S. Appl. No. 14/667,331, filed Mar. 24, 2015.

\* cited by examiner

PILLAR ARRANGEMENT IN NAND MEMORY

CROSS-REFERENCE TO RELATED APPLICATION

This application is a continuation of U.S. application Ser. No. 14/667,331 filed Mar. 24, 2015, and entitled "PILLAR ARRANGEMENT IN NAND MEMORY," the disclosure of which is hereby incorporated by reference herein in its entirety for all purposes.

FIELD

Embodiments of the present disclosure generally relate to the field of integrated circuits (IC), and more particularly, to techniques and configurations for providing pillar arrangements in vertical memory, such as a three-dimensional NAND memory.

BACKGROUND

Memory provides data storage for electronic systems. Flash memory is one of various memory types, which has numerous uses in modern computers and devices. A typical flash memory may comprise a memory array that includes a large number of non-volatile memory cells arranged in row and column fashion. The cells may usually be grouped into blocks. Each of the cells within a block may be electrically programmed by charging a floating gate. The charge may be removed from the floating gate by a block erase operation. Data may be stored in a cell as charge in the floating gate. NAND memory array may comprise a basic architecture of flash memory.

In recent years, vertical memory, such as three-dimensional (3D) memory has been developed. A 3D flash memory (e.g., 3D NAND memory array) device may include a plurality of strings of charge storage devices (memory cells) stacked over one another (e.g., in a first of three dimensions of 3D) with each charge storage device corresponding to one of multiple tiers of the device. The charge storage devices of a respective string may share a common channel region, such as one formed in a respective pillar of semiconductor material (e.g., polysilicon) about which the string of charge storage devices may be formed.

In a second dimension, each first group of the plurality of strings may comprise, for example, a group of strings sharing a plurality of access lines, known as wordlines (WLs). Each of the plurality of access lines may couple (e.g., electrically or otherwise operably connect) the charge storage devices (memory cells) corresponding to a respective tier of the plurality of tiers of each string. The charge storage devices coupled by the same access line (and thus corresponding to the same tier) may be logically grouped into memory pages, when each charge storage device comprises a multi-level cell capable of storing two bits of information.

In a third dimension, each group of the plurality of strings may comprise a group of strings coupled by corresponding data lines, known as bitlines (BLs). During operation of a computing device, data stored in the memory may be subjected to periodic (e.g., continuous) manipulations. These manipulations may be caused by internal control mechanisms, directed, for example, to optimize memory capacity, location areas, speed of access to memory, and the like. For example, the data may be moved from one area of memory to another area, copied from one area to another area, and the like. Accordingly, time to internally access data stored in a memory unit (e.g., memory block) may become an important factor in overall speed of manipulation of the data in the memory. For example, the lower the access time to a memory block, the lower is the time for an operation related to internal data manipulation.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
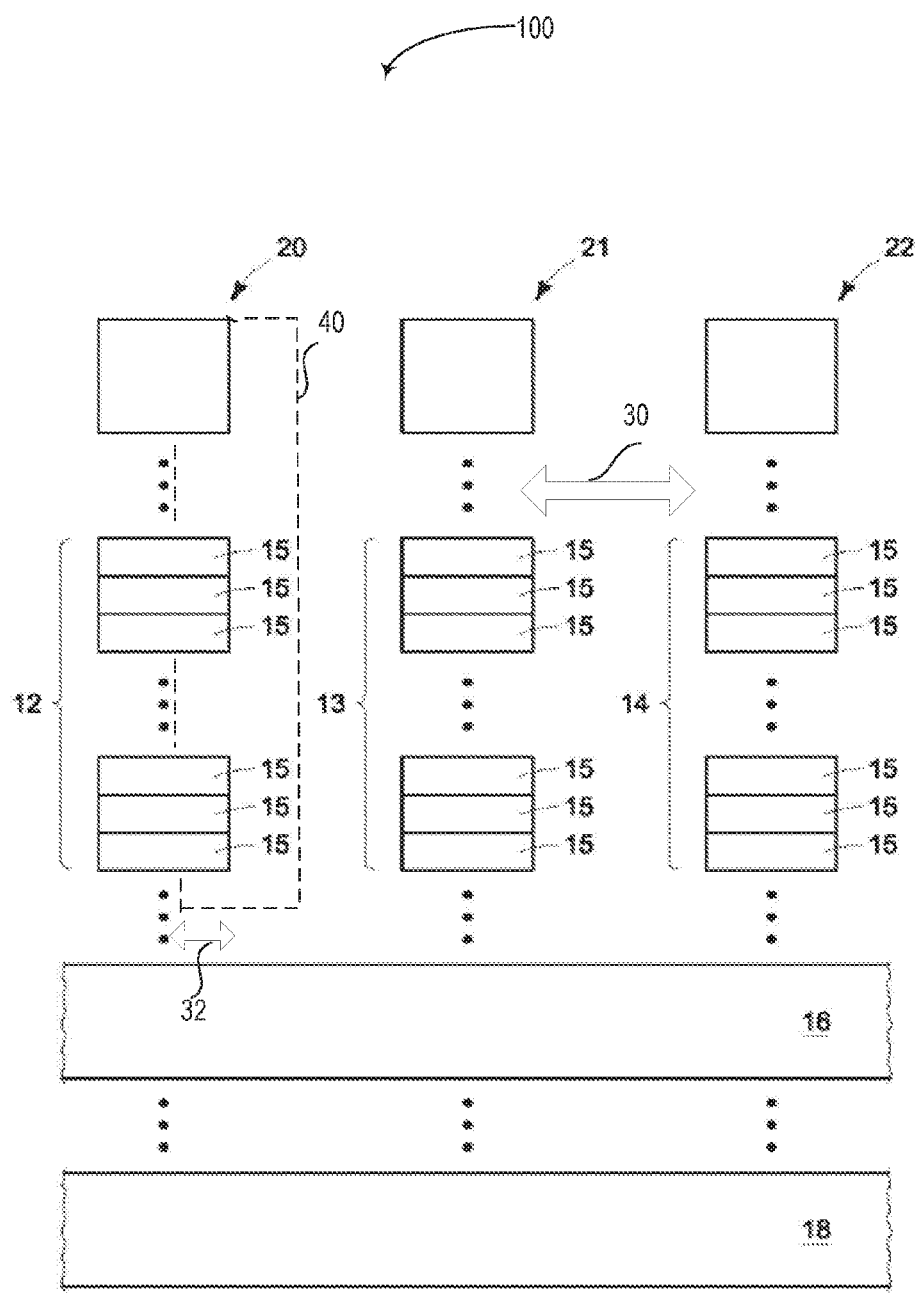
FIG. 1 is a side view of an example apparatus comprising a 3D memory array, in accordance with some embodiments of the present disclosure.

Embodiments of the present disclosure describe techniques and configurations for providing an apparatus comprising a 3D memory array with a shifted pillar arrangement. In one embodiment, the apparatus may include a substantially hexagonal arrangement having seven semiconductor pillars disposed in a die in a repeating pattern. The arrangement may include first and second pillars disposed at a pillar pitch from each other in a first row; third, fourth, and fifth pillars disposed at the pillar pitch from each other in a second row; and sixth and seventh pillars disposed at the determined pitch from each other in a third row and shifted relative to the first and second pillars respectively by a quarter of the pillar pitch in a direction that is substantially orthogonal to bitlines disposed in the die. Each pillar in the arrangement may be electrically coupled with a different bitline.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

FIG. 1 is a side view of an example apparatus comprising a 3D memory array, in accordance with some embodiments. More specifically, the apparatus 100 may include a plurality of vertically-stacked memory cells 15 arranged in rows and columns along with access lines (e.g., word lines, not shown) and data lines (e.g., bitlines, not shown).

In embodiments, the memory cells 15 may be stacked upon each other in vertical stacks or pillars 12, 13, 14, to form a 3D memory structure. Breaks are provided within pillars 12, 13, 14 of memory cells 15 to indicate that there may be additional memory cells besides those shown. Any suitable number of memory cells may be present. For instance, the individual stacks (pillars) 12-14 may comprise 8 memory cells, 16 memory cells, 32 memory cells, 64 memory cells, . . . , 256 memory cells, 512 memory cells, etc.

The pillars 12-14 may be provided over an electrically conductive material 16, which in turn may be supported by a semiconductor base (die) 18. A break is provided between the material 16 and the base 18 to indicate that there may be additional materials and/or integrated circuit structures between the base 18 and the material 16. Similarly, a break is provided between the material 16 and each of the stacks 12-14 to indicate that there may be additional materials and/or integrated circuit structures between the pillars 12, 13, 14, and the material 16. The material 16 may comprise a common source and/or source-side select gate (SGS), with the term "source-side" indicating that material 16 is on the source side of the stacks (pillars) 12-14. The material 16 may comprise, for example, p-type doped silicon and/or other suitable conductively-doped semiconductor material.

Bitlines (not shown) may be provided above material 16, with such bitlines being "drain" connections to stacks (pillars). Semiconductor base 18 may comprise semiconductor material, and in some embodiments may comprise monocrystalline silicon. Drain-side select gate (SGD) devices 20, 21, 22 (e.g., transistors having the SGD devices as control gates) may be provided over pillars 12, 13, 14, respectively. The SGD devices 20, 21, 22 may comprise one or more of various metals (for instance, tungsten, titanium, etc.), metal-containing compositions (for instance, metal silicide, metal nitride, etc.), and conductively doped semiconductor materials (for instance, conductively-doped silicon). The SGD devices 20, 21, 22 are drain-side devices in that they are on the drain side of the pillars 12, 13, 14. The pillars 12, 13, 14 may be disposed on the base 18 at a distance (pillar pitch) 30 from each other.

It will be appreciated that the front view of the apparatus 100 in FIG. 1 illustrates a front "tile" of pillars 12, 13, 14. A plurality of pillars comprising the memory array of the apparatus 100 may be arranged on the base (die) 18 in a number of different spatial configurations, depending on technological requirements to the apparatus 100. In some embodiments, some pillars may be disposed such as to be spatially shifted relative to each other by a distance that may comprise a fraction of the pillar pitch 30. For example pillar 40 (illustrated in dashed lines) may be spatially disposed at a horizontal distance 32 from pillar 12 that may comprise a fraction (e.g., a quarter) of the pillar pitch 30. Such pillar arrangement of the memory array of the apparatus 100 will be called a shifted pillar arrangement and described in detail in reference to FIG. 2.

Figure 2:
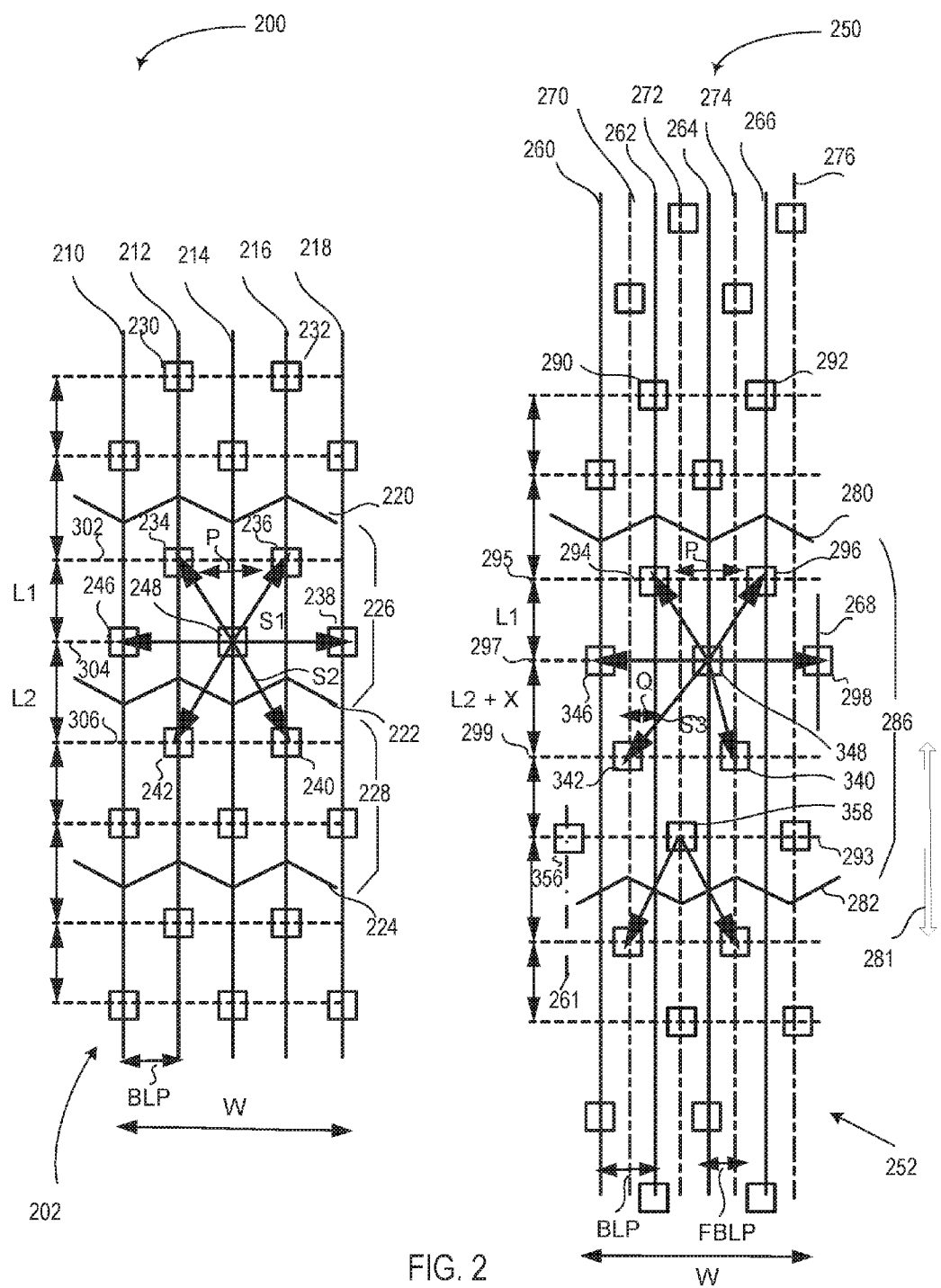
FIG. 2 is a top view of an example apparatus comprising a 3D memory array that includes pillars in a shifted pillar arrangement, compared to a 3D memory array with a hexagonal pillar arrangement, in accordance with some embodiments.

FIG. 2 is a top view of an example apparatus comprising a 3D memory array that includes pillars in a shifted pillar arrangement, compared to a 3D memory array with a hexagonal pillar arrangement, in accordance with some embodiments of the present disclosure.

More specifically, FIG. 2 illustrates a top view of a 3D memory array 200 having a hexagonally closest pack pillar arrangement and a top view of a 3D memory array 250 having a shifted pillar arrangement. The memory array 200 is provided next to the array 250 in FIG. 2 for illustration purposes, in order to provide a comparison with the shifted pillar arrangement of the 3D memory array 250 in accordance with embodiments of the present disclosure. The memory arrays 200 and 250 are shown as disposed respectively on dies 202 and 252 of the same width W. It will be appreciated that perspective-based descriptors, such as vertical or horizontal, may be used to facilitate discussion. These descriptors do not limit the implementations of embodiments of the disclosure.

The memory array 200 may comprise bitlines 210, 212, 214, 216, 218 disposed at a characteristic (e.g., standard) bitline pitch BLP from each other to vertically traverse the memory array 200. The term bitline pitch, as used herein, may be a distance between the center of one bit line and the center of the adjacent bit line in a direction of the wordlines (not shown), or in a direction perpendicular to the bitlines. In embodiments, the characteristic bitline pitch BLP may comprise about 82 nm.

The memory array 250 with shifted pillar arrangement may comprise bitlines 260, 262, 264, 266, 268 that are disposed at the characteristic bitline pitch BLP from each other to vertically traverse the array 250. The bitlines 260, 262, 264, 266, 268 of the array 250 may correspond to the respective bitlines 210, 212, 214, 216, 218 of the array 200. It will be appreciated that a number of bitlines shown in the arrays 200 and 250 is provided for illustration purposes only and is not limiting this disclosure. Any number of bitlines may be disposed on the dies 202 and 252 depending on the width W of the die.

In addition to the bitlines 260, 262, 264, 266, 268, bitlines 270, 272, 274, 276 may be disposed in the die 252 to vertically traverse the array 250 such that a distance full bit line pitch (FBLP) between the adjacent bitlines comprises a fraction of BLP, e.g., half of the characteristic bitline pitch BLP, as shown in the array 250. For example, the distance between bitlines 260 and 270, 270 and 262, 262 and 272, 272 and 264, 264 and 274, 274 and 266, 266 and 276, and 276 and 268 may comprise at least a half of BLP, or FBLP. In embodiments, FBLP may comprise about 41 nm. In other words, the number of bitlines in the array 250 may at least double, compared to the array 200, by disposing bitlines at half of the characteristic bitline pitch FBLP.

The memory arrays 200 and 250 may each comprise a plurality of pillars (e.g., 230 and 232 in the array 200, and 290 and 292 in the array 250) that may be electrically connected to corresponding bitlines. The memory arrays 200 and 250 may further include a number of electrical lines arranged parallel to the wordlines (not shown) that may be selectively controlled to access various sets of the memory cells in respective pillars. The electrical lines may include select gate drains (SGD devices described in reference to FIG. 1), where each SGD device may be electrically coupled with a respective pillar, to control selection of pillars corresponding to a particular wordline. The electrical lines connecting SGD devices will be called SGD lines for purposes of description. The wave-like lines 220, 222, and 224 shown in the memory array 200 may delineate the SGD lines associated with memory array 200. For example, two SGD lines 226 and 228 are shown as formed between the wave-like lines 220 and 222, and 222 and 224 respectively. Similarly, an SGD line 286 may be formed between the wave-like lines 280 and 282 in the memory array 250.

As described above, the pillars in the memory array 200 may be arranged in a repeating pattern comprising hexagonally closest pack pillar arrangement formed, e.g., by pillars 234, 236, 238, 240, 242, 246, and 248. As shown, the pillars 234 and 236 may be disposed along a first imaginary line 302, and the pillars 246, 248, and 238 may be disposed along a second imaginary line 304. The imaginary lines 302 and 304 may be substantially orthogonal to the bitlines 210, 212, and 304.

As shown, a distance between imaginary lines 302 and 304, and accordingly, vertical distance between the pillars 234, 236, and 246, 248, and 238 may be L1. Note that the above-mentioned pillars may be electrically coupled with the SGD line 226. A distance between imaginary lines 304 and 306, and accordingly, vertical distance between the pillars 246, 248, and 238, and 242, and 240 may be L2. The distance L1 may be different (e.g., smaller) than the distance L2, because the pillars 246, 248, and 238 may be coupled with the SGD line 226, whereas pillars 242 and 240 may be coupled with an adjacent SGD line, e.g., the SGD line 228.

In some embodiments, L1 may comprise about 143 nm, and L2 may comprise about 150 nm, to maintain desired spacing S1 and S2 between pillars, e.g., spacing S1 between pillars 248 and 236, and S2 between pillars 248 and 240. In some embodiments, S1 may comprise about 164 nm, and S2 may comprise about 171 nm. As shown, adjacent pillars disposed on the same imaginary line (e.g., pillars 234 and 236) may be disposed at a distance (pillar pitch P) from each other in the memory array 200. It will be appreciated that each of the pillars electrically coupled with the same SGD line may be electrically coupled to a single bitline. For example, pillar 246 is coupled with bitline 210, pillar 234 is coupled with bitline 212, pillar 248 is coupled with bitline 214, and so on.

As shown in the memory array 250, pillars 294, 296, 298, 348, and 346 may substantially repeat the pattern formed by the pillars 234, 236, 238, 248, and 246. It should be noted that adjacent pillars disposed on the same imaginary line (e.g., pillars 294 and 296) may be disposed at the pillar pitch P from each other in the memory array 250.

In contrast to the pillar arrangement of memory array 200, pillars 340 and 342, disposed along imaginary line 299 that is orthogonal the bitlines 260, 270, may be disposed with an offset (e.g., shift) relative to the pillars 294, 296 along the imaginary line 299. For example, pillar 342 may be shifted by a fraction, e.g., at least a quarter of the pillar pitch Q from pillar 294, and pillar 340 may be shifted by at least Q from pillar 296. Similarly, a pair of pillars 356, 358 may be shifted along imaginary line 293 by the quarter of the pillar pitch Q from the pair of pillars 346 and 348 respectively. Note that the horizontal pillar pitch approximately equals four bit line pitches.

It should be noted that pillars 294 and 296 may be coupled with bitlines 262 and 266 that may correspond to bitlines 212 and 216 of the memory array 200. Pillars 342 and 340 (shifted relative to pillars 294 and 296) may be coupled with bitlines 270 and 274, which may be additionally disposed at a quarter horizontal pillar pitch from bitlines 262 and 266, as described above. Similarly, pillars 346 and 348 may be coupled with bitlines 260 and 264 that may correspond to bitlines 210 and 214 of the memory array 200. Pillars 356 and 358 (shifted relative to 346 and 348) may be coupled with bitlines 261 and 272, which may be additionally disposed at a quarter horizontal pillar pitch from bitlines 260 and 264.

Each pillar in the shifted pillar arrangement that is associated with the SGD line 286 may be electrically coupled with a different bitline of the memory array 250. For example, pillar 356 may be coupled with bitline 261, pillar 346 may be coupled with the bitline 260, pillar 342 may be coupled with the bitline 270, pillar 294 may be coupled with the bitline 262, and so on. The shifting pillar pattern described above may be repeated in the provision of memory array 250.

Spacing between the pillars 294 and 348 may be maintained the same as spacing S1 between corresponding pillars 248, 236 of the memory array 200. However, spacing between shifted pillar 342 and pillar 348 or between shifted pillar 340 and pillar 348 may increase, in order to maintain desired spacing between pillars. For example, spacing S3 between shifted pillar 342 and pillar 348 may be about 200 nm. Accordingly, distance between imaginary lines 295 and 297 may be L1 (same as corresponding distance in the memory array 200), while distance between imaginary lines 297 and 299 may increase to L2+X, compared to corresponding distance L2. In embodiments, L2+X may be about 159 nm.

The shifted pillar arrangement described in reference to memory array 250 may have a number of advantages compared to the hexagonal pillar arrangement of the memory array 200. For example, the shifted pillar arrangement of the memory array 250 may provide at least twice as many rows of pillars for a given SGD line, compared to the memory array 200. For example, the memory array 250 comprises four rows of pillars disposed along imaginary lines 295, 297, 299, and 293 for given SGD line 286, compared to two rows of pillars disposed along the imaginary lines 302 and 304 for given SGD line 226 in memory array 200.

Effectively, the height of SGD line in the memory array 250 may at least double, compared to the height of SGD line in the memory array 200. Accordingly, the height of the memory array 250 may increase in vertical direction (illustrated by arrow 281), compared to the memory array 200, but the width of the memory array 250 may decrease in the horizontal direction compared to the width (W) of the memory array 200. Thus, the die size (density) of the memory array 250 may remain the same as the die size (density) of the memory 200 (e.g., in horizontal direction). Further, due to the shifting pillar arrangement, the bitline pitch of the memory array 250 may be reduced (e.g., at least by half) compared to the bitline pitch BLP of the memory array 200, allowing for allocation of at least twice as many bitlines in the same width W of the die comprising the memory array 250.

Due to increased (e.g., doubled) bitline allocation and corresponding increase in the height of the memory array 250, the density of memory cells in the memory array 250 may remain the same as that of the memory array 200. Reducing the bitline pitch to at least half of the characteristic bitline pitch and offsetting (shifting) pillars with respect to each other for each SGD line may effectively reduce the number of pages per block of the memory array 250, compared to the memory array 200. Accordingly, a copy time (e.g., time to copy a block of memory array 250) may be reduced, compared to a copy time of a block of memory array 200. If the physical width of the array 250 is kept the same as the width of array 200, then the number of bit lines may double. In this case, for a given die density the height of array 250 remains the same as array 200, but the number of SGDs of array 250 halves. Hence for the same number of blocks in both array 200 and 250, the number of SGDs and pages per block also halves for array 250. Hence the block copy time may also be halved for array 250 over 200.

Figure 3:
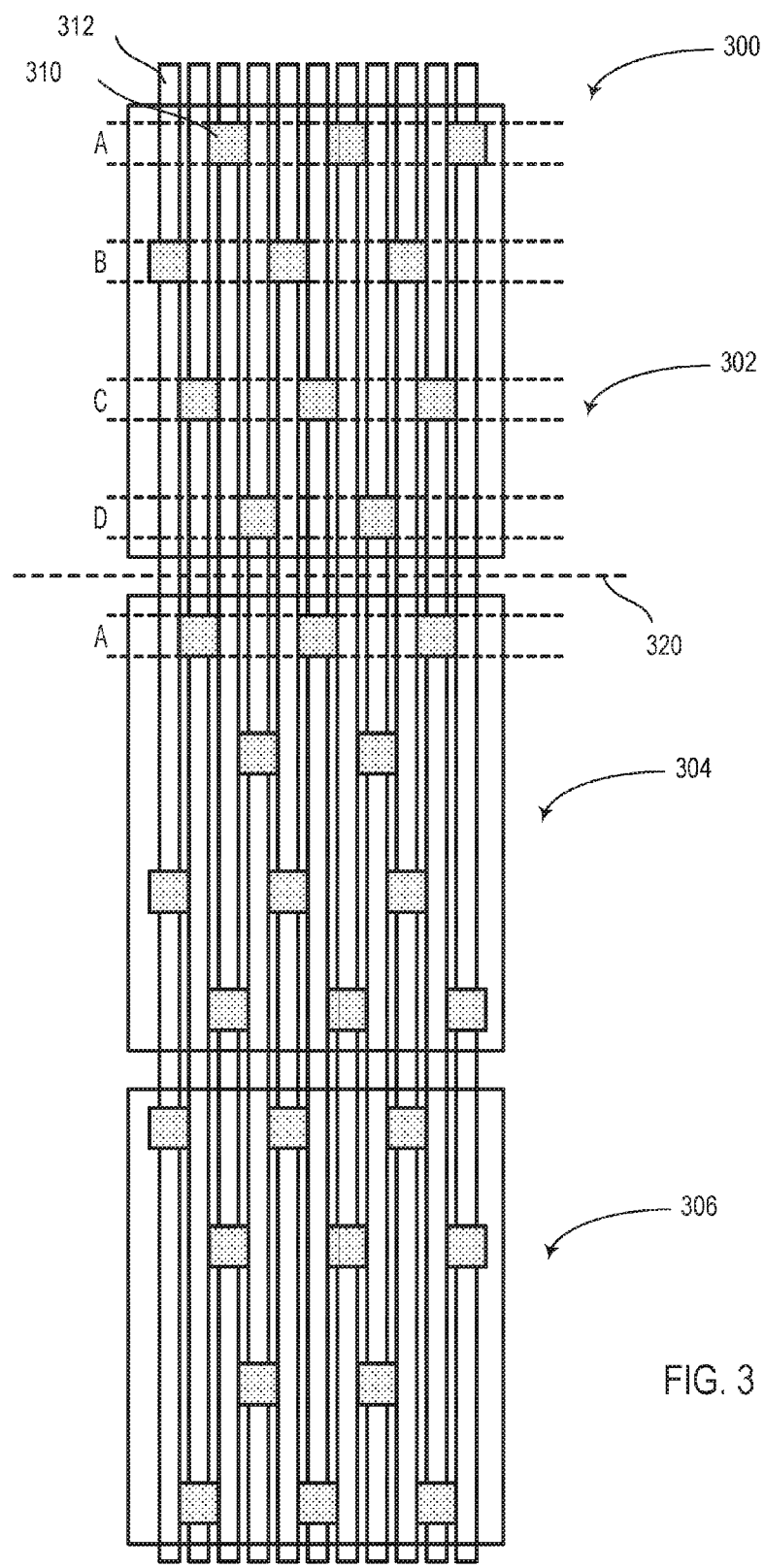
FIG. 3 illustrates a top view of an example portion of a 3D memory array with a shifted pillar arrangement, in accordance with some embodiments.

FIG. 3 is a top view of an example portion of a memory array with shifted pillar arrangement, in accordance with some embodiments of the present disclosure. The memory array 300 may include multiple memory sub blocks 302, 304, 306 (only three sub blocks are shown in FIG. 3 for simplicity purposes). For illustration purposes, the memory sub block 302 is shown as having four rows A, B, C, D of pillars 310 electrically connected to respective bitlines 312. Also for illustration purposes, it may be assumed that the A, B, C, D of pillars 310 may be coupled with a single SGD line. As shown, only one pillar may intercept a given bitline on a given SGD line. Based on a shifted pillar arrangement described in reference to FIG. 2, it may be seen that in block 302, row B of pillars may be shifted two bitlines with respect to row A, row C may be shifted one bitline with respect to row B, row D may be shifted two bitlines with respect to row C, and row A of block 304 may be shifted two bitlines with respect to row D, both within block 304 and across a sub block boundary 320. It will be understood that row A may correspond to imaginary line 295 of FIG. 2, and row C may correspond to imaginary line 299 of FIG. 2. Accordingly, row C may be shifted by a quarter of a pillar pitch or one bitline with respect to row A, as described in reference to FIG. 2. Similarly, row D may be shifted by a quarter of the pillar pitch or one bitline with respect to row B, and so on.

Figure 4:
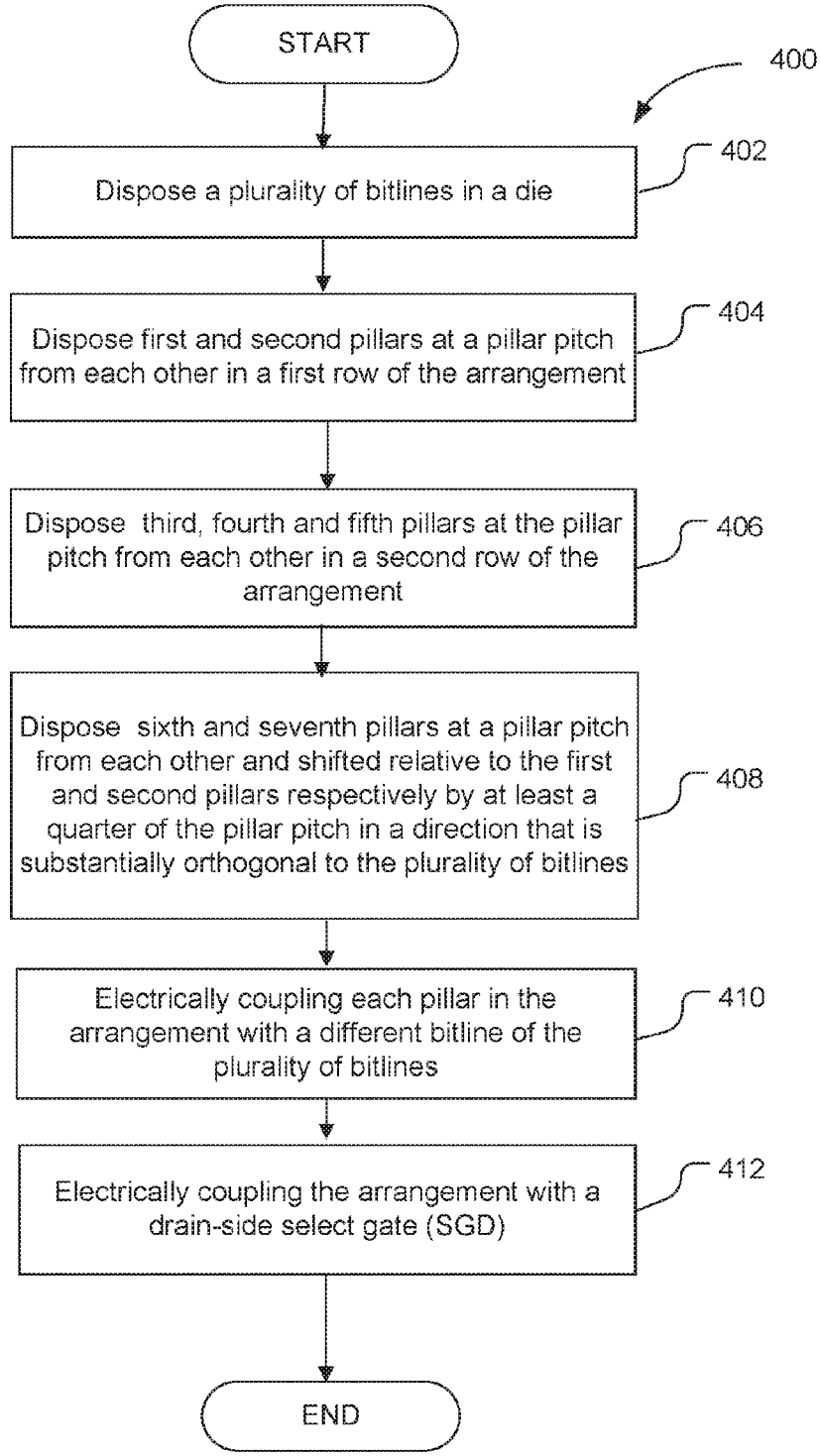
FIG. 4 is a flow diagram for a method of fabricating an apparatus comprising a 3D memory array with a shifted pillar arrangement, in accordance with some embodiments.

FIG. 4 is a flow diagram for a method of fabricating an apparatus comprising a 3D memory array with shifted pillar arrangement, in accordance with some embodiments. The method 400 may comport with actions described in connection with FIGS. 2-3 in some embodiments.

At block 402, the method 400 may include disposing a plurality of bitlines in a die. As discussed in reference to FIG. 2, the bitlines may be disposed at least at a half of characteristic bitline pitch from each other.

At block 404, the method 400 may further include disposing a substantially hexagonal arrangement having seven semiconductor pillars in the die, including disposing first and second pillars at a pillar pitch from each other in a first row of the arrangement.

At block 406, the method 400 may further include disposing third, fourth and fifth pillars at the pillar pitch from each other in a second row of the arrangement.

At block 408, the method 400 may further include disposing sixth and seventh pillars at the determined pitch from each other and shifted relative to the first and second pillars respectively by a fraction (e.g., at least a quarter) of the pillar pitch in a direction that is substantially orthogonal to the plurality of bitlines.

At block 410, the method 400 may further include electrically coupling each pillar in the arrangement with a different bitline of the plurality of bitlines.

At block 412, the method 400 may further include electrically coupling the arrangement with a drain-side select gate.

The method 400 may be performed in different ways, to provide a 3D memory array with the shifted pillar configuration. For example, as discussed above, the substantially hexagonal arrangement with shifted pillars may be a repeating pattern forming the 3D memory array. Accordingly, there may be different ways of providing the repeating pattern with a shifted pillar arrangement on a die, in order to form the 3D memory array.

Various operations of the method 400 are described as multiple discrete operations, in a manner that is most helpful in understanding the claimed subject matter. However, the order of description should not be construed as to imply that these operations are necessarily order dependent. It will be appreciated that the sequence of operations associated with method 400 may vary and/or include other actions in accordance with the present disclosure.

The memory arrays and methods described herein may be implemented into a system using any suitable hardware and/or software to configure as desired.

Figure 5:
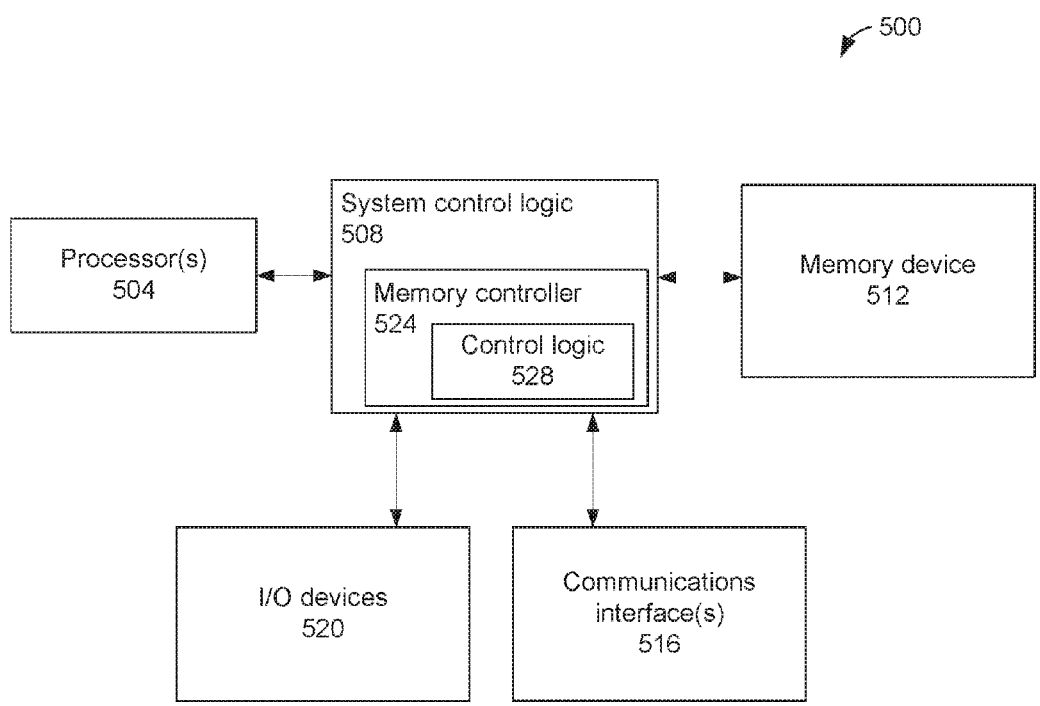
FIG. 5 schematically illustrates an example computing device 500 in accordance with some embodiments.

FIG. 5 schematically illustrates an example computing device 500 in accordance with some embodiments. The computing device 500 may include system control logic 508 coupled to one or more processor(s) 504, a memory device 512, one or more communications interface(s) 516, and input/output (I/O) devices 520.

The memory device 512 may be a non-volatile computer storage chip that includes the memory array 250 or the memory array 300. In addition to the memory array, the memory device 512 may include a package, having the memory array 250 or 300 disposed therein, driver circuitry (e.g., drivers), input/output connections to electrically couple the memory device 512 with other components of the computing device 500, etc. The memory device 512 may be configured to be removably or permanently coupled with the computing device 500.

Communications interface(s) 516 may provide an interface for computing device 500 to communicate over one or more network(s) and/or with any other suitable device. Communications interface(s) 516 may include any suitable hardware and/or firmware. Communications interface(s) 516 for one embodiment may include, for example, a network adapter, a wireless network adapter, a telephone modem, and/or a wireless modem. For wireless communications, communications interface(s) 516 for one embodiment may use one or more antennas to communicatively couple the computing device 500 with a wireless network.

For one embodiment, at least one of the processor(s) 504 may be packaged together with logic for one or more controller(s) of system control logic 508. For one embodiment, at least one of the processor(s) 504 may be packaged together with logic for one or more controllers of system control logic 508 to form a System in Package (SiP). For one embodiment, at least one of the processor(s) 504 may be integrated on the same die with logic for one or more controller(s) of system control logic 508. For one embodiment, at least one of the processor(s) 504 may be integrated on the same die with logic for one or more controller(s) of system control logic 508 to form a System on Chip (SoC).

System control logic 508 for one embodiment may include any suitable interface controllers to provide for any suitable interface to at least one of the processor(s) 504 and/or to any suitable device or component in communication with system control logic 508. The system control logic 508 may move data into and/or out of the various components of the computing device 500.

System control logic 508 for one embodiment may include a memory controller 524 to provide an interface to the memory device 512 to control various memory access operations. The memory controller 524 may include control logic 528 that is specifically configured to control the memory device 512 as described herein. In various embodiments, the control logic 528 may include instructions stored in a non-transitory computer-readable medium (e.g., the memory device 512 or other memory/storage) that, when executed by at least one of the processor(s) 504, cause the memory controller 524 to perform the above-described operations.

In various embodiments, the I/O devices 520 may include user interfaces designed to enable user interaction with the computing device 500, peripheral component interfaces designed to enable peripheral component interaction with the computing device 500, and/or sensors designed to determine environmental conditions and/or location information related to the computing device 500. In various embodiments, the user interfaces could include, but are not limited to, a display, e.g., a liquid crystal display, a touch screen display, etc., a speaker, a microphone, one or more digital cameras to capture pictures and/or video, a flashlight (e.g., a light emitting diode flash), and a keyboard. In various embodiments, the peripheral component interfaces may include, but are not limited to, a non-volatile memory port, an audio jack, and a power supply interface. In various embodiments, the sensors may include, but are not limited to, a gyro sensor, an accelerometer, a proximity sensor, an ambient light sensor, and a positioning unit. The positioning unit may additionally/alternatively be part of, or interact with, the communications interface(s) 516 to communicate with components of a positioning network, e.g., a global positioning system (GPS) satellite.

In various embodiments, the computing device 500 may be a mobile computing device such as, but not limited to, a laptop computing device, a tablet computing device, a netbook, a smartphone, etc.; a desktop computing device; a workstation; a server; etc. The computing device 500 may have more or fewer components, and/or different architectures. In further implementations, the computing device 500 may be any other electronic device that processes data.

According to various embodiments, the present disclosure describes a number of examples.

Example 1 is an apparatus, comprising: a plurality of pillars disposed in a die, wherein the plurality of pillars comprises: a first pillar grouping having at least a first pillar electrically coupled with a first bitline and a second pillar electrically coupled with a second bitline and disposed at a pillar pitch from the first pillar along a first imaginary line that is substantially orthogonal to the first and second bitlines; and a second pillar grouping having at least a third pillar electrically coupled with a third bitline and shifted by at least a quarter of the pillar pitch from the first pillar along a second imaginary line that is substantially orthogonal to the bitlines, and a fourth pillar electrically coupled with a fourth bitline and disposed at the pillar pitch from the third pillar and shifted by the quarter of the pillar pitch from the second pillar along the second imaginary line.

Example 2 may include the subject matter of Example 1, wherein the first pillar grouping further includes a fifth pillar electrically coupled with a fifth bitline, and a sixth pillar electrically coupled with a sixth bitline and disposed at the pillar pitch from the fifth pillar along a third imaginary line that is substantially orthogonal to the first and second bitlines, and wherein the second pillar grouping further includes a seventh pillar electrically coupled with a seventh bitline and shifted by at least a quarter of the pillar pitch from the fifth pillar along a fourth imaginary line that is substantially orthogonal to the first and second bitlines, and an eighth pillar electrically coupled with an eighth bitline and disposed at the pillar pitch from the seventh pillar and shifted by the quarter of the pillar pitch from the sixth pillar along the fourth imaginary line.

Example 3 may include the subject matter of Example 2, wherein the first and second imaginary lines are disposed at a first distance from each other.

Example 4 may include the subject matter of Example 3, wherein the second and third imaginary lines are disposed at a second distance from each other, wherein the second distance is different from the first distance.

Example 5 may include the subject matter of Example 4, wherein the first and second distances are to provide a desired spacing between the pillars of the first and second groupings.

Example 6 may include the subject matter of Example 2, wherein the first and fifth bitlines are disposed at a characteristic bitline pitch from each other, the first and sixth bitlines are disposed at the characteristic bitline pitch from each other, and the sixth and second bitlines are disposed at the characteristic bitline pitch from each other.

Example 7 may include the subject matter of Example 6, wherein the third bitline is disposed between the fifth and first bitlines at least a half of the characteristic bitline pitch from the fifth and first bitlines, wherein the fourth bitline is disposed between the sixth and second bitlines at the half of the characteristic bitline pitch from the sixth and second bitlines.

Example 8 may include the subject matter of Example 1, wherein each of the pillars in the first and second groupings is encompassed by a drain-side select gate (SGD).

Example 9 may include the subject matter of any of Examples 1 to 8, wherein the apparatus comprises a three-dimensional (3D) memory array.

Example 10 may include the subject matter of Example 9, wherein the 3D memory array comprises a 3D NAND memory array.

Example 11 is an apparatus, comprising a substantially hexagonal arrangement having seven pillars disposed in a die in a repeating pattern, wherein the arrangement includes first and second pillars disposed at a pillar pitch from each other in a first row of the arrangement, third, fourth, and fifth pillars disposed at the pillar pitch from each other in a second row of the arrangement, and sixth and seventh pillars disposed at the pillar pitch from each other in a third row of the arrangement and shifted relative to the first and second pillars respectively by at least a quarter of the pillar pitch in a direction that is substantially orthogonal to a plurality of bitlines disposed in the die, wherein each pillar in the arrangement is electrically coupled with a different bitline of the plurality of bitlines.

Example 12 may include the subject matter of Example 11, wherein each of the pillars in the arrangement is encompassed by a drain-side select gate (SGD).

Example 13 may include the subject matter of Example 11, wherein the apparatus comprises a three-dimensional (3D) memory array.

Example 14 may include the subject matter of Example 11, wherein the bitlines are disposed at least half of a characteristic bitline pitch from each other.

Example 15 may include the subject matter of any of Examples 11 to 14, wherein the first and second rows are disposed at a first distance from each other, wherein the second and third rows are disposed at a second distance from each other, wherein the second distance is different from the first distance.

Example 16 may include the subject matter of Example 15, wherein the first and second distances are to provide a desired spacing between the pillars of the arrangement.

Example 17 is a method for providing a memory device, comprising: disposing a plurality of bitlines in a die; disposing a substantially hexagonal arrangement having seven pillars in the die, including: disposing first and second pillars at a pillar pitch from each other in a first row of the arrangement; disposing third, fourth, and fifth pillars at the pillar pitch from each other in a second row of the arrangement; and disposing sixth and seventh pillars at the pillar pitch from each other and shifted relative to the first and second pillars respectively by at least a quarter of the pillar pitch in a direction that is substantially orthogonal to the plurality of bitlines; and electrically coupling each pillar in the arrangement with a different bitline of the plurality of bitlines.

Example 18 may include the subject matter of Example 17, further comprising: electrically coupling the arrangement with a drain-side select gate (SGD).

Example 19 may include the subject matter of any of Examples 17 to 18, further comprising: repeating the disposing of the arrangement in the die, to provide a structure comprising a three-dimensional (3D) memory array.

Example 20 may include the subject matter of Example 19, wherein the structure comprises a 3D NAND memory array.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A method, comprising:
   disposing a plurality of bitlines in a die;
   disposing a substantially hexagonal arrangement having seven pillars in the die, including:
      disposing first and second pillars at a pillar pitch from each other in a first row of the arrangement;
      disposing third, fourth, and fifth pillars at the pillar pitch from each other in a second row of the arrangement;
      disposing sixth and seventh pillars at the pillar pitch from each other in a third row of the arrangement and shifted relative to the first and second pillars respectively by a quarter of the pillar pitch in a first direction that is substantially orthogonal to the plurality of bitlines disposed in the die, and shifted relative to the third and fourth pillars by the quarter of the pillar pitch in a second direction that is substantially orthogonal to the plurality of bitlines, wherein each pillar in the arrangement is electrically coupled with a different bitline of the plurality of bitlines, wherein the second row is located between the first and third rows; and
      electrically coupling each of the pillars in the arrangement with a drain-side select gate (SGD); and
   electrically coupling each pillar in the arrangement with a different bitline of the plurality of bitlines.

2. The method of claim 1, further comprising: repeating the disposing of the arrangement in the die, to provide a structure comprising a three-dimensional (3D) memory array.

3. The method of claim 2, wherein the structure comprises a 3D NAND memory array.

4. The method of claim 1, wherein disposing a plurality of bitlines in a die includes disposing the bitlines at least half of a characteristic bitline pitch from each other.

5. The method of claim 1, wherein disposing the first, second, third, fourth, fifth, sixth, and seventh pillars includes disposing the first and second rows at a first distance from each other, and disposing the second and third rows at a second distance from each other, wherein the second distance is different from the first distance.

6. The method of claim 5, wherein the first and second distances are selected to provide a desired spacing between the pillars of the arrangement.

7. A method for providing a memory device, comprising:
   providing a first pillar grouping of a plurality of pillars in a die, wherein providing includes disposing a second pillar at a pillar pitch from a first pillar along a first imaginary line that is substantially orthogonal to first and second bitlines, electrically coupling the first pillar with a first bitline, and electrically coupling the second pillar with a second bitline, and providing a second pillar grouping of the plurality of pillars in the die, wherein providing includes shifting a third pillar by a quarter of the pillar pitch from the first pillar along a second imaginary line that is substantially orthogonal to the bitlines, and electrically coupling the third pillar with a third bitline; and disposing a fourth pillar to be placed at the pillar pitch from the third pillar and shifted by the quarter of the pillar pitch from the second pillar along the second imaginary line, and electrically coupling the fourth pillar with a fourth bitline, wherein providing the first pillar grouping further includes disposing a sixth pillar to be placed at the pillar pitch from a fifth pillar along a third imaginary line that is substantially orthogonal to the first and second bitlines, and electrically coupling the fifth pillar with a fifth bitline, and electrically coupling the sixth pillar with a sixth bitline, wherein the third imaginary line is located between the first and second imaginary lines, wherein providing the second pillar grouping further includes shifting a seventh pillar by the quarter of the pillar pitch from the fifth pillar along a fourth imaginary line that is substantially orthogonal to the first and second bitlines, and electrically coupling the seventh pillar with a seventh bitline; and disposing an eighth pillar to be placed at the pillar pitch from the seventh pillar and shifted by the quarter of the pillar pitch from the sixth pillar along the fourth imaginary line, and electrically coupling the eighth pillar with an eighth bitline, wherein the second imaginary line is located between the third and fourth imaginary lines, and coupling the first and second pillar groupings with a drain-side select gate (SGD) line.

8. The method of claim 7, wherein the first and second imaginary lines are disposed at a first distance from each other.

9. The method of claim 8, wherein the second and third imaginary lines are disposed at a second distance from each other, wherein the second distance is different from the first distance.

10. The method of claim 7, further comprising: disposing the first and fifth bitlines at a characteristic bitline pitch from each other, disposing the first and sixth bitlines at the characteristic bitline pitch from each other, and disposing the sixth and second bitlines at the characteristic bitline pitch from each other.

11. The method of claim 10, further comprising: disposing the third bitline between the fifth and first bitlines at a half of the characteristic bitline pitch from the fifth and first bitlines, and disposing the fourth bitline between the sixth and second bitlines at the half of the characteristic bitline pitch from the sixth and second bitlines.

12. The method of claim 7, wherein the memory device comprises a three-dimensional (3D) memory array.

* * * * *